United States Patent
Murase et al.

(10) Patent No.: US 11,362,634 B2
(45) Date of Patent: Jun. 14, 2022

(54) FILTER MODULE AND HIGH FREQUENCY MODULE

(71) Applicant: Murata Manufacturing Co., Ltd., Kyoto (JP)

(72) Inventors: Hisanori Murase, Kyoto (JP); Naru Morito, Kyoto (JP); Hiromichi Kitajima, Kyoto (JP); Ryangsu Kim, Kyoto (JP); Yasushi Shigeno, Kyoto (JP); Kenta Seki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 55 days.

(21) Appl. No.: 16/944,777

(22) Filed: Jul. 31, 2020

(65) Prior Publication Data

US 2020/0366263 A1 Nov. 19, 2020

Related U.S. Application Data

(63) Continuation of application No. PCT/JP2018/046056, filed on Dec. 14, 2018.

(30) Foreign Application Priority Data

Feb. 1, 2018 (JP) .............................. JP2018-016352

(51) Int. Cl.
*H03H 7/01* (2006.01)
*H05K 1/02* (2006.01)
*H03H 1/00* (2006.01)

(52) U.S. Cl.
CPC ......... *H03H 7/0115* (2013.01); *H05K 1/0243* (2013.01); *H03H 2001/0085* (2013.01);
(Continued)

(58) Field of Classification Search
CPC .................... H03H 7/0115; H03H 2001/0085
(Continued)

(56) References Cited

U.S. PATENT DOCUMENTS

| 6,700,792 B1 * | 3/2004 | Bando ...................... H03F 1/22 257/728 |
| 2005/0176380 A1 | 8/2005 | Okabe et al. |

(Continued)

FOREIGN PATENT DOCUMENTS

| JP | 2003060465 A | 2/2003 |
| JP | 2005223582 A | 8/2005 |

(Continued)

OTHER PUBLICATIONS

International Search Report issued in Application No. PCT/JP2018/046056, dated Feb. 26, 2019.

(Continued)

*Primary Examiner* — Rakesh B Patel
(74) *Attorney, Agent, or Firm* — Pearne & Gordon LLP

(57) ABSTRACT

A filter module includes a first ground terminal, a second ground terminal, a low pass filter, and a second inductor. The low pass filter includes a first inductor provided in an input/output path of signal, a first capacitor provided in a first path connecting a first node and the first ground terminal, and a second capacitor provided in a second path connecting a second node and the second ground terminal. The second inductor is connected in series to the second capacitor in a path connecting the second capacitor and the second ground terminal. The first path and the second path are not connected to each other by any path except the one between the first node and the second node.

19 Claims, 11 Drawing Sheets

(52) U.S. Cl.
CPC ............... *H05K 2201/1006* (2013.01); *H05K 2201/10053* (2013.01)

(58) Field of Classification Search
USPC .................................................. 333/175, 185
See application file for complete search history.

(56) References Cited

U.S. PATENT DOCUMENTS

| | | | |
|---|---|---|---|
| 2009/0189714 A1* | 7/2009 | Sakisaka | H03H 7/1758 |
| | | | 333/185 |
| 2011/0133853 A1 | 6/2011 | Harima et al. | |
| 2015/0091776 A1* | 4/2015 | Gaynor | H04B 1/18 |
| | | | 343/860 |
| 2015/0135252 A1 | 5/2015 | Muterspaugh et al. | |
| 2016/0142041 A1 | 5/2016 | Kuwahara | |

FOREIGN PATENT DOCUMENTS

| | | | |
|---|---|---|---|
| JP | 2005229525 A | 8/2005 |
| JP | 2008271421 A | 11/2008 |
| JP | 2011120105 A | 6/2011 |
| JP | 2012054635 A | 3/2012 |
| JP | 2013211605 A | 10/2013 |
| JP | 2015528232 A | 9/2015 |
| JP | 2016096439 A | 5/2016 |

OTHER PUBLICATIONS

Written Opinion issued in Application No. PCT/JP2018/046056, dated Feb. 26 2019.

\* cited by examiner

FILTER MODULE AND HIGH FREQUENCY MODULE

This is a continuation of International Application No. PCT/JP2018/046056 filed on Dec. 14, 2018 which claims priority from Japanese Patent Application No. 2018-016352 filed on Feb. 1, 2018. The contents of these applications are incorporated herein by reference in their entireties.

BACKGROUND OF THE DISCLOSURE

Field of the Disclosure

The present disclosure relates to a filter module including a LC filter and a high frequency module including this filter module.

Description of the Related Art

A filter module including a LC filter including an inductor and a capacitor is known in the art. As an example of such a filter module, Japanese Unexamined Patent Application Publication No. 2003-60465 (patent document 1) discloses a filter module including a low pass filter that includes an inductor provided in an input/output path of high frequency signals, a first capacitor provided between one end portion of the inductor and ground, and a second capacitor provided between the other end portion of the inductor and the ground.

BRIEF SUMMARY OF THE DISCLOSURE

However, in the filter module including a low pass filter disclosed in the patent document 1, the attenuation outside the pass band of the LC filter is degraded in some cases.

The present disclosure is made to resolve the foregoing issue, and an object thereof is to provide a filter module and the like, which are capable of suppressing the degradation of attenuation outside the pass band of the LC filter.

In order to achieve the foregoing object, a filter module according to one aspect of the present disclosure includes: a first ground terminal; a second ground terminal that is different from the first ground terminal; a low pass filter including a first inductor, a first capacitor, and a second capacitor, the first inductor being provided in an input/output path of signal, the first capacitor being provided in a first path connecting the first ground terminal and a first node of the input/output path on one end portion side of the first inductor, the second capacitor being provided in a second path connecting the second ground terminal and a second node of the input/output path on another end portion side of the first inductor; and a second inductor connected in series to the second capacitor in a path connecting the second capacitor and the second ground terminal, the path being part of the second path, wherein the first path and the second path are connected to one another in between the first node and the second node via the first inductor and not connected to one another by any path except a path between the first node and the second node.

As described above, by having the configuration in which the first path and the second path are not connected to one another by any path except the path between the first node and the second node, an attenuation pole generated by LC resonance of the second inductor and the second capacitor can be maintained. This enables to suppress the degradation of attenuation outside the pass band of the low pass filter.

The filter module may further include: a multilayer substrate; and a mount component mounted on the multilayer substrate, wherein the first ground terminal and the second ground terminal may be formed on the multilayer substrate, at least part of the low pass filter may be included in the mount component, and at least one of the second inductor and the second capacitor may be included in at least one of the multilayer substrate and the mount component.

This enables to form at least part of the low pass filter using the mount component and to provide the filter module having a stable attenuation characteristic.

The filter module may further include a ground electrode provided in a path connecting the first capacitor and the first ground terminal, the path being part of the first path, wherein the ground electrode may be provided in inside of the multilayer substrate and may not be connected to the second path in the inside of the multilayer substrate.

As described above, by having the structure in which the ground electrode provided in the multilayer substrate is not connected to the second path in the inside of the multilayer substrate, it becomes possible to hinder a signal having entered the ground electrode from going into the second path. This enables to maintain an attenuation pole generated by LC resonance of the second inductor and the second capacitor and to suppress the degradation of attenuation outside the pass band of the low pass filter.

The at least one of the second inductor and the second capacitor may be provided in inside of the multilayer substrate.

As described above, by providing at least one of the second inductor and the second capacitor in the inside of the multilayer substrate, a design change of the inductance value of the second inductor or the capacitance value of the second capacitor can be made easily, and this enables to form an attenuation pole using LC resonance of the second inductor and the second capacitor in a required frequency band. This enables to suppress the degradation of attenuation outside the pass band of the low pass filter.

A filter module according to one aspect of the present disclosure includes: a first ground terminal; a second ground terminal that is different from the first ground terminal; a high pass filter including a first capacitor, a first inductor, and a second inductor, the first capacitor being provided in an input/output path of signal, the first inductor being provided in a first path connecting the first ground terminal and a first node of the input/output path on one end portion side of the first capacitor, the second inductor being provided in a second path connecting the second ground terminal and a second node of the input/output path on another end portion side of the first capacitor; and a second capacitor connected in series to the second inductor in a path connecting the second inductor and the second ground terminal, the path being part of the second path, wherein the first path and the second path are connected to one another in between the first node and the second node via the first capacitor and not connected to one another by any path except a path between the first node and the second node.

As described above, by having the configuration in which the first path and the second path are not connected to one another by any path except the path between the first node and the second node, an attenuation pole generated by LC resonance of the second capacitor and the second inductor can be maintained. This enables to suppress the degradation of attenuation outside the pass band of the high pass filter.

The filter module may further include: a multilayer substrate; and a mount component mounted on the multilayer substrate, wherein the first ground terminal and the second ground terminal may be formed on the multilayer substrate, at least part of the high pass filter may be included in the mount component, and at least one of the second inductor and the second capacitor may be included in at least one of the multilayer substrate and the mount component.

This enables to form at least part of the high pass filter using the mount component and to provide the filter module having a stable attenuation characteristic.

The filter module may further include a ground electrode provided in a path connecting the first inductor and the first ground terminal, the path being part of the first path, wherein the ground electrode may be provided in inside of the multilayer substrate and may not be connected to the second path in the inside of the multilayer substrate.

As described above, by having the structure in which the ground electrode provided in the multilayer substrate is not connected to the second path in the inside of the multilayer substrate, it becomes possible to hinder a signal having entered the ground electrode from going into the second path. This enables to maintain an attenuation pole generated by LC resonance of the second capacitor and the second inductor and to suppress the degradation of attenuation outside the pass band of the high pass filter.

The at least one of the second capacitor and the second inductor may be provided in inside of the multilayer substrate.

As described above, by providing at least one of the second inductor and the second capacitor in the inside of the multilayer substrate, a design change of the inductance value of the second inductor or the capacitance value of the second capacitor can be made easily, and this enables to form an attenuation pole using LC resonance of the second inductor and the second capacitor in a required frequency band. This enables to suppress the degradation of attenuation outside the pass band of the high pass filter.

The multilayer substrate may include one or more ground electrodes, the one or more ground electrodes including the ground electrode, and the second path may not be connected to any of the one or more ground electrodes in the inside of the multilayer substrate.

According to this, even in the case where a signal has entered into any of the ground electrodes inside of the multilayer substrate, because no ground electrode is connected to the second path, it becomes possible to hinder the foregoing signal from going into the second path. This enables to maintain an attenuation pole generated by LC resonance of the second inductor and the second capacitor and to suppress the degradation of attenuation outside the pass band of the low pass filter or the high pass filter.

The two or more ground terminals including the first ground terminal and the second ground terminal may be formed on the multilayer substrate, and the second path may not be connected to any of the two or more ground terminals except the second ground terminal in the multilayer substrate.

As described above, by making the second path as an independent path that is not connected to any ground terminal in the multilayer substrate except the second ground terminal, it becomes possible to hinder an unwanted signal from entering the second path. This enables to maintain an attenuation pole generated by LC resonance of the second inductor and the second capacitor and to suppress the degradation of attenuation outside the pass band of the low pass filter or the high pass filter.

The filter module may have a structure in which the second inductor is provided in the inside of the multilayer substrate, and the second inductor does not overlap the ground electrode in a plan view of the multilayer substrate viewed from one principal surface side of the multilayer substrate.

This enables to hinder an unwanted signal from entering the second path from the ground electrode. This enables to maintain an attenuation pole generated by LC resonance of the second inductor and the second capacitor and to suppress the degradation of attenuation outside the pass band of the low pass filter.

The filter module may have a structure in which the second capacitor is provided in the inside of the multilayer substrate, and the second capacitor does not overlap the ground electrode in a plan view of the multilayer substrate viewed from one principal surface side of the multilayer substrate.

This enables to hinder an unwanted signal from entering the second path from the ground electrode. This enables to maintain an attenuation pole generated by LC resonance of the second capacitor and the second inductor and to suppress the degradation of attenuation outside the pass band of the high pass filter.

The filter module may include a first filter portion that is the foregoing filter module including the low pass filter, and a second filter portion that is the foregoing filter module including the high pass filter, wherein the input/output path of the first filter portion and the input/output path of the second filter portion may be connected to one another in series.

As described above, by including the first filter portion including the low pass filter and the second filter portion including the high pass filter in the filter module, the filter module including a band pass filter having an excellent attenuation characteristic can be provided.

The filter module may include a first filter portion that is the foregoing filter module including the low pass filter and a second filter portion that is the foregoing filter module including the high pass filter, wherein the mount component of the first filter portion and the mount component of the second filter portion may be formed into a same single mount component, and the multilayer substrate of the first filter portion and the multilayer substrate of the second filter portion may be formed into a same single multilayer substrate.

As described above, by forming the first filter portion including the low pass filter and the second filter portion including the high pass filter in the filter module into a single mount component, at least part of a band pass filter can be formed as the mount component, and the filter module having a stable attenuation characteristic can be provided.

A high frequency module according to one aspect of the present disclosure includes the foregoing filter module and a mounting board on which the filter module is mounted.

This enables to provide the high frequency module including the filter module that enables to suppress the degradation of attenuation outside the pass band of the low pass filter of the high pass filter.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Details That Led to the Present Disclosure

Referring to FIG. 1 to FIG. 4, filter modules relating to comparison examples are described.

Figure 1:
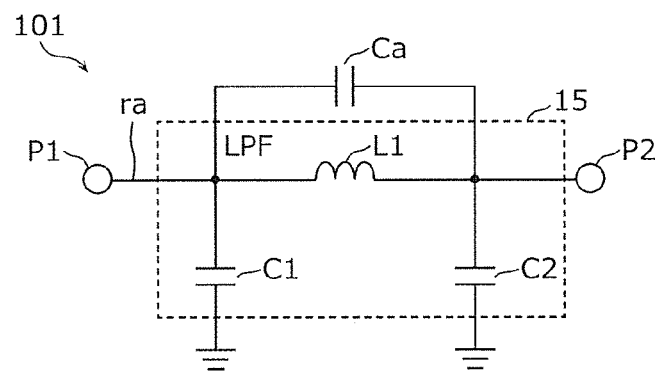
FIG. 1 is a circuit diagram of a filter module of a comparison example 1.

FIG. 1 is a circuit diagram of a filter module 101 of a comparison example 1.

The filter module 101 of the comparison example 1 includes a low pass filter (hereinafter, referred to as LPF) 15. The LPF 15 includes an inductor L1 provided in an input/output path ra of a signal and connects input/output ports P1 and P2, a first capacitor C1 provided between one end portion of the inductor L1 and ground, and a second capacitor C2 provided between the other end portion of the inductor L1 and the ground. In this filter module 101, a capacitor Ca for attenuation pole adjustment is connected in parallel to the inductor L1. The filter module 101 is, for example, a filter module whose pass band is a band of frequencies not higher than about 1 GHz.

Figure 2:
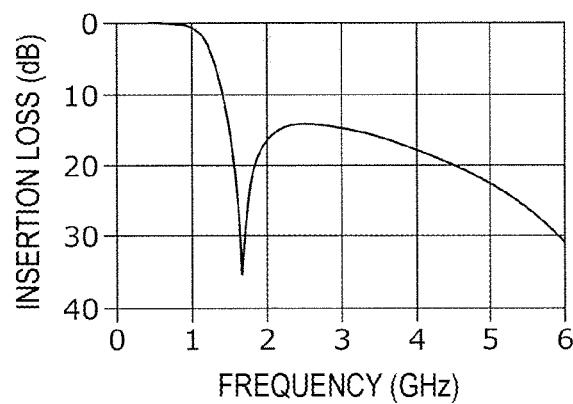
FIG. 2 is a diagram illustrating an attenuation characteristic of the filter module of the comparison example 1.

FIG. 2 is a diagram illustrating an attenuation characteristic of the filter module 101 of the comparison example 1. As illustrated in FIG. 2, in the filter module 101 of the comparison example 1, although an attenuation pole is formed in the vicinity of a frequency of about 1.8 GHz, the attenuation is degraded in the vicinity of about 2.2 GHz, which is outside of the pass band.

Figure 3:
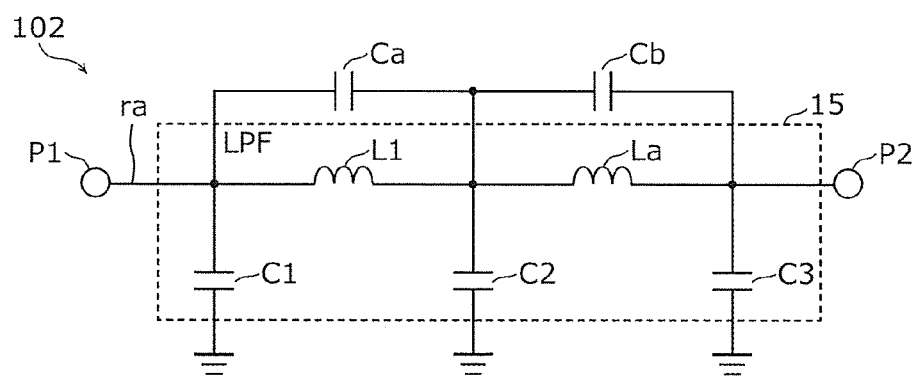
FIG. 3 is a circuit diagram of a filter module of a comparison example 2.

FIG. 3 is a circuit diagram of a filter module 102 of a comparison example 2.

A LPF 15 of the filter module 102 of the comparison example 2 has a configuration in which another LPF is added to the LPF illustrated in the comparison example 1. Specifically, the filter module 102 includes an inductor La connected in series to the inductor L1, a capacitor C3 connected between the ground and a node between the inductor La and the input/output port P2, and a capacitor Cb connected in parallel to the inductor La.

Figure 4:
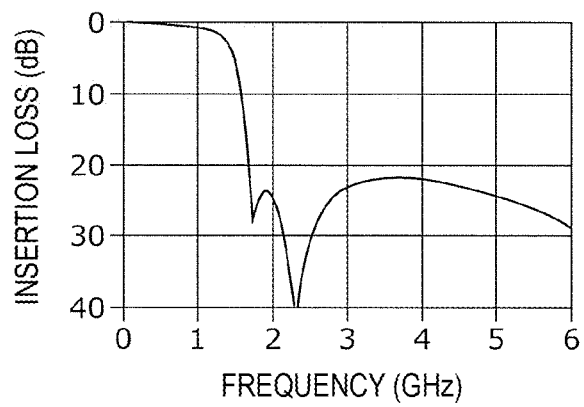
FIG. 4 is a diagram illustrating an attenuation characteristic of the filter module of the comparison example 2.

FIG. 4 is a diagram illustrating an attenuation characteristic of the filter module 102 of the comparison example 2. As illustrated in FIG. 4, because of another LPF that has been added, an attenuation pole, which is different from the attenuation pole in the vicinity of about 1.8 GHz, is formed in the vicinity of about 2.3 GHz. Because of this, compared with the filter module 101 of the comparison example 1, in the filter module 102, the degradation of attenuation outside the pass band of the LPF 15 is suppressed. However, because of the addition of the LPF, in the filter module 102, three electronic elements (inductor La, capacitor C3, and capacitor Cb) are needed. This poses a problem of an increase in the size of the filter module 102.

Note that although the low pass filter is described in the above, these problems may similarly occur in a π-type high pass filter (HPF) including an inductor and a capacitor. In other words, in a π-type high pass filter including a capacitor provided in an input/output path of signal and inductors provided between the ground and both end portions of the capacitor, which will be illustrated in an embodiment 3, the degradation of attenuation will be also suppressed if another HPF is added. However, this poses a problem of an increase in the size of the filter module.

Filter modules and the like according to the present embodiment each have a configuration that enables to suppress degradation of attenuation outside the pass band of LPF or HPF. Furthermore, the filter modules and the like according to the present embodiment each have the configuration that enables to suppress an increase in the size of the filter module.

In the following section, filter modules and the like according to embodiments of the present disclosure are described with reference to the drawings. Note that embodiments which will be described below each illustrate a preferred specific example of the present disclosure. Numeric values, shapes, materials, constituting elements, arrangement positions and connection modes of the constituting elements, fabrication processes, sequences of the fabrication processes, and the like, which will be illustrated in the following embodiments, are mere examples. The same reference codes are attached to substantially the same configuration elements throughout the drawings, and overlapping descriptions therefor are omitted or simplified.

Embodiment 1

1-1. Circuit Configuration of Filter Module

Figure 5:
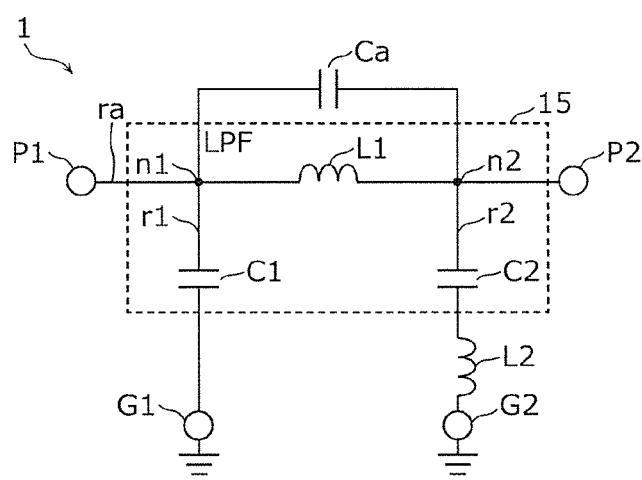
FIG. 5 is a circuit diagram of a filter module according to an embodiment 1.
Figure 6:
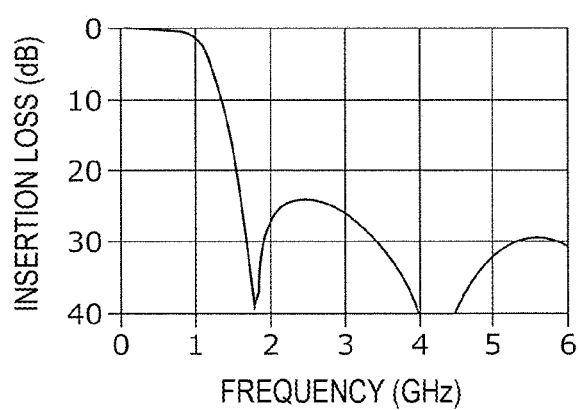
FIG. 6 is a diagram illustrating an attenuation characteristic of the filter module according to the embodiment 1.

Referring to FIG. 5 and FIG. 6, a filter module 1 of the embodiment 1 is described.

FIG. 5 is a circuit diagram of the filter module 1 according to the embodiment 1. The filter module 1 includes a LPF 15, a second inductor L2, a first ground terminal G1, and a second ground terminal G2.

The first ground terminal G1 and the second ground terminal G2 are part of external terminals included in the filter module 1. The first ground terminal G1 and the second ground terminal G2 are terminals connected to the ground and are each connected to the ground via a mother board on which the filter module 1 is mounted.

The LPF 15 is arranged in the input/output path ra of signals, which is a path connecting the input/output ports P1 and P2. The LPF 15 includes a first inductor L1, a first capacitor C1, and a second capacitor C2. The first inductor L1 is connected in series in the input/output path ra. The first capacitor C1 is provided in a first path r1 that connects the first ground terminal G1 and a first node n1 of the input/output path ra on the side of one end portion of the first inductor L1. The second capacitor C2 is provided in a second path r2 that connects the second ground terminal G2 and a second node n2 in the input/output path ra on the side of the other end portion of the first inductor L1. These input/output path ra, the first path r1, and the second path r2 are not paths in space but are physical objects in existence, and are for example formed from a mount component and/or wirings provided in a multilayer substrate, which will be described later.

Note that in this filter module 1, a capacitor Ca for attenuation pole adjustment is connected in parallel to the first inductor L1 in the input/output path ra. The capacitor Ca is not an essential constituting element in the present embodiment.

The second inductor L2 is connected in series to the second capacitor C2 in a path connecting the second capacitor C2 and the second ground terminal G2, and this path is part of the second path r2. The provision of the second inductor L2 allows the filter module 1 to have a series LC resonant circuit including the second inductor L2 and the second capacitor C2.

In the configuration of the present embodiment, the first path r1 and the second path r2 are connected to each other in between the first node n1 and the second node n2 via the first inductor L1 and not connected to each other by any path except the one between the first node n1 and the second node n2.

FIG. 6 is a diagram illustrating an attenuation characteristic of the filter module 1.

As illustrated in FIG. 6, Because of LC resonance of the second inductor L2 and the second capacitor C2, an attenuation pole, which is different from the attenuation pole in the vicinity of about 1.8 GHz, is formed in the vicinity of about 4.2 GHz in the filter module 1. Because of this, compared with the filter module 101 of the comparison example 1, in the filter module 1, the degradation of attenuation outside the pass band is suppressed.

Furthermore, in the filter module 1, another attenuation pole is formed in the vicinity of about 4.2 GHz only by adding a single electronic element, which is the second inductor L2. Accordingly, compared with the filter module 102 of the comparison example 2, in the filter module 1, another attenuation pole can be formed using a smaller number of components, and the degradation of attenuation outside the pass band of the LPF 15 (or stop band) can be suppressed.

Note that the first ground terminal G1 and the second ground terminal G2 are not connected to each other in the inside of the filter module 1. Advantageous effects of this structure are described below in comparison with a filter module 103 of the comparison example 3. Note that in this specification, the term "being connected" means "being connected" by a means that exists as a physical object such as wiring or the like, and does not include the case of "being connected" by a means that does not exist as a physical object, such as electromagnetic coupling or the like.

Figure 7:
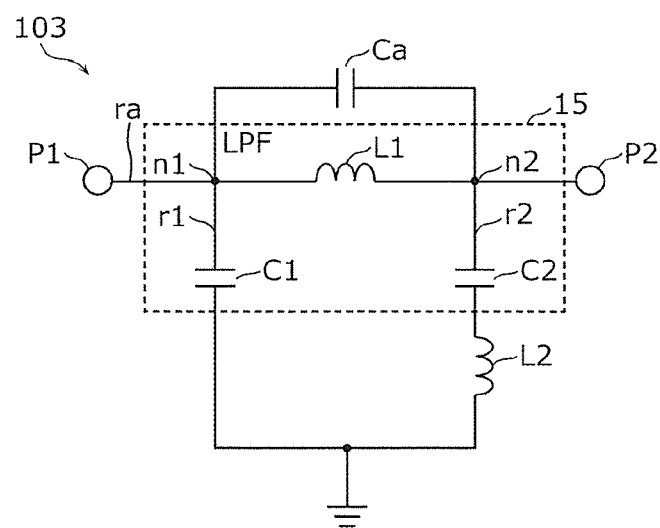
FIG. 7 is a circuit diagram of a filter module of a comparison example 3.

FIG. 7 is a circuit diagram of the filter module 103 of the comparison example 3.

In the filter module 103 of the comparison example 3, the first path r1 and the second path r2 are connected to the same ground in the inside of the filter module 103. Specifically, a wiring line of a path between the first capacitor C1 and the ground, which is part of the first path r1, and a wiring line of a path between the second inductor L2 and the ground, which is part of the second path r2, are connected together in a midway and then connected to the same ground. As a result, a signal having entered the first path r1 may go into the second path r2 via the ground. This may pose a problem of degradation in functionality of a series LC resonant circuit including the second inductor L2 and the second capacitor C2.

Figure 8:
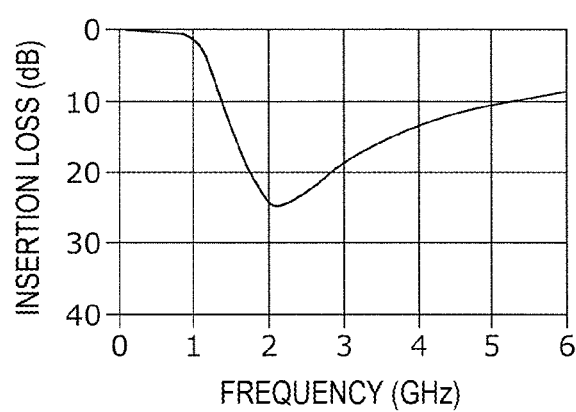
FIG. 8 is a diagram illustrating an attenuation characteristic of the filter module of the comparison example 3.

FIG. 8 is a diagram illustrating an attenuation characteristic of the filter module 103 of the comparison example 3. As illustrated in FIG. 8, in the filter module 103 of the comparison example 3, the attenuation pole in the vicinity of about 4.2 GHz illustrated in FIG. 6 disappeared, and the attenuation outside the pass band is degraded.

Whereas, in the filter module 1 of the present embodiment, the first path r1 connecting the first node n1 and the first ground terminal G1 and the second path r2 connecting the second node n2 and the second ground terminal G2 are not connected to each other by any path except the path between the first node n1 and the second node n2 of the input/output path ra. The first path r1 and the second path r2 are connected to different grounds, respectively. This enables the filter module 1 to maintain another attenuation pole different from the attenuation pole of the LPF 15 and to suppress the degradation of attenuation outside the pass band.

Note that in the present embodiment, the second capacitor C2 and the second inductor L2 are connected in this order when the second ground terminal G2 is viewed from the second node n2 which is on the other end portion side of the first inductor L1. Alternatively, the second capacitor C2 and the second inductor L2 may be connected in the opposite order. That is to say, when the second ground terminal G2 is viewed from the second node n2, the second inductor L2 and the second capacitor C2 may be connected in this order.

1-2. Structure of Filter Module

Next, referring to FIG. 9 to FIG. 12, the structure of the filter module 1 is described.

Figure 9:
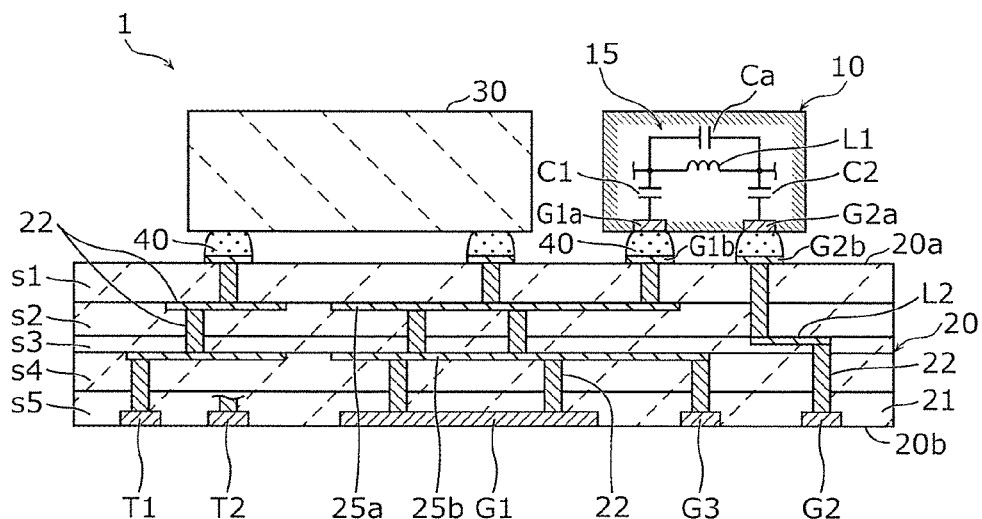
FIG. 9 is a cross-sectional view of the filter module according to the embodiment 1.
Figure 10:
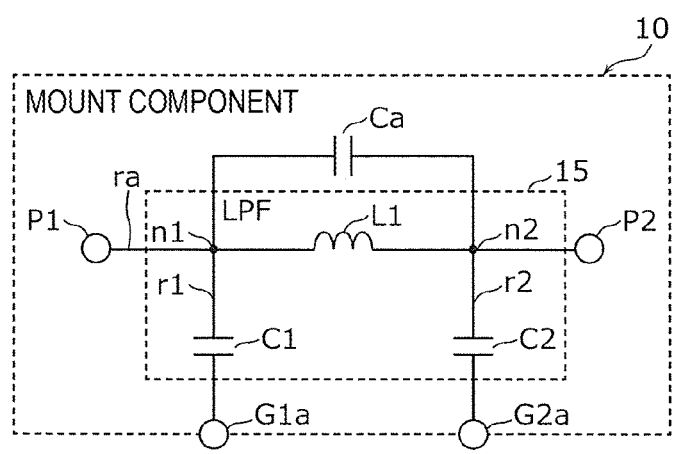
FIG. 10 is a circuit diagram of a mount component of the filter module according to the embodiment 1.

FIG. 9 is a cross-sectional view of the filter module 1. FIG. 10 is a circuit diagram of a mount component 10 of the filter module 1.

The filter module 1 includes the mount component 10, an IC chip 30, and a multilayer substrate 20. In the filter module 1 of the present embodiment, the LPF 15 is provided in the mount component 10, and the second inductor L2 is provided in the multilayer substrate 20.

The IC chip 30 is, for example, a semiconductor circuit device including a semiconductor device such as a switching element or the like.

The mount component 10 is a filter component having a substantially rectangular parallelepiped outer shape. The mount component 10 includes the LPF 15 including the first inductor L1, the first capacitor C1, and the second capacitor C2 and the capacitor Ca connected in parallel to the first inductor L1. The mount component 10 may be a multilayer ceramic component or an integrated passive device (IPD). In the mount component 10, the input/output path ra, the part of the first path r1, and the part of the second path r2, which are described above, are formed. These input/output path ra, the part of the first path r1, and the part of the second path r2 are formed from wirings provided in the mount component 10.

At a bottom face of the mount component 10, ground ports G1a and G2a, which are the external terminals, are formed. The ground port G1a is connected to the first capacitor C1 of the LPF 15, and the ground port G2a is connected to the second capacitor C2 of the LPF 15. Note that the bottom face of the mount component 10 is a surface that faces one principal surface 20a of the multilayer substrate 20 when the mount component 10 is mounted on the multilayer substrate 20. The mount component 10 is mounted on the multilayer substrate 20 using a joining material 40.

Ground ports G1b and G2b, which are connection electrodes, are formed on the one principal surface 20a of the multilayer substrate 20. The ground port G1a of the mount component 10 is connected to the ground port G1b of the multilayer substrate 20 with the joining material 40 interposed therebetween, and the ground port G2a of the mount component 10 is connected to the ground port G2b of the multilayer substrate 20 with the joining material 40 interposed therebetween.

The multilayer substrate 20 includes a substrate portion 21 formed by stacking a plurality of substrate layers s1, s2, s3, s4, and s5 on top of each other and conductor portions 22 provided in the inside of and on the surfaces of the multilayer substrate 20. The conductor portions 22 are made up of patterning conductors and interlayer conductors and, for example, formed of a metallic material whose main component is copper or silver. The multilayer substrate 20 may be a substrate including a ceramic material, or a flexible substrate including a resin material, or a semiconductor circuit substrate formed by using a photolithography process. Of the first path r1 and the second path r2, parts other than the ones formed in the mount component 10, which are the remaining part of the first path r1 and the remaining part of the second path r2, are formed in the multilayer substrate 20. These remaining part of the first path r1 and remaining part of the second path r2 are formed from wirings including the conductor portions 22.

Ground electrodes 25a and 25b are provided in the inside of the multilayer substrate 20. The ground electrodes 25a and 25b are each a common ground electrode that makes ground potentials of a plurality of electronic components mounted on the multilayer substrate 20 uniform. Each of the ground electrodes 25a and 25b is provided in a path connecting the first capacitor C1 of the mount component 10 and the first ground terminal G1, and this path is part of the first path r1. The ground electrodes 25a and 25b are formed of the same metallic material as that of the conductor portions 22.

Furthermore, the second inductor L2 is formed in the inside of the multilayer substrate 20. The second inductor L2 is formed of the same metallic material as that of the conductor portions 22.

The ground electrodes 25a and 25b are connected to the ground port G1b via the conductor portions 22. Whereas, the second inductor L2 is not connected to the ground electrode 25a or the ground electrode 25b in the inside of the multilayer substrate 20 and is connected to the ground port G2b via the conductor portions 22.

On the other principal surface 20b of the multilayer substrate 20, a plurality of external terminals are provided. In FIG. 9, as part of the plurality of external terminals, a signal terminals T1 and T2, the first ground terminal G1, the second ground terminal G2, and a third ground terminal G3 are illustrated.

The signal terminals T1 and T2 are each a terminal for inputting/outputting a high frequency signal to/from the filter module 1 or a terminal for inputting a control signal for controlling the filter module 1. The signal terminals T1 and T2 are each connected to the mount component 10 or the IC chip 30 via the conductor portions 22.

The first ground terminal G1 is connected to the ground electrodes 25b and 25a via the conductor portions 22. In other words, the first ground terminal G1 is connected to the ground port G1b via the conductor portions 22 and the ground electrodes 25a and 25b and further connected to the ground port G1a of the mount component 10 with the joining material 40 interposed therebetween.

The third ground terminal G3 is connected to the ground electrodes 25b and 25a and further connected to the first ground terminal G1 via each of the ground electrodes 25b and 25a. In this way, in the filter module 1, all the ground terminals (for example, the first ground terminal G1 and the third ground terminal G3) except the second ground terminal G2 are connected to the ground electrodes (for example, the ground electrodes 25a and 25b) provided in the inside of the multilayer substrate 20.

The second ground terminal G2 is connected to the second inductor L2 via the conductor portions 22. In other words, the second ground terminal G2 is connected to the ground port G2b via the conductor portions 22 and the second inductor L2 and further connected to the ground port G2a of the mount component 10 with the joining material 40 interposed therebetween. The second ground terminal G2 is an independent terminal not connected to the first ground terminal G1 or the third ground terminal G3 in the multilayer substrate 20. Accordingly, in the inside of the multilayer substrate 20, the second path r2 leading to the second ground terminal G2 is not connected to any of the ground electrodes (for example, the ground electrodes 25b and 25a) provided inside the multilayer substrate 20. Further, in the multilayer substrate 20, the second path r2 is not connected to any of the ground terminals (for example, the first ground terminal G1 and the third ground terminal G3) except the second ground terminal G2.

The filter module 1 of the present embodiment includes the ground electrodes 25a and 25b provided in the first path r1 and has a structure in which the ground electrodes 25a and 25b are not connected to the second path r2. That is to say, the filter module 1 has such a structure that the first path r1 and the second path r2 are not connected to each other by any path except the path between the first node n1 and the second node n2 inside of the filter module 1. Accordingly, it becomes possible to hinder a signal having entered the ground electrode 25a or the ground electrode 25b from going into the second path r2. This enables to maintain an attenuation pole generated by LC resonance of the second inductor L2 and the second capacitor C2 and to suppress the degradation of attenuation outside the pass band of the LPF 15.

Note that in the present embodiment, the filter module 1 is illustrated in which the second capacitor C2 is provided in the mount component 10 and the second inductor L2 is incorporated within the multilayer substrate 20. Alternatively, the second inductor L2 may be provided in the mount component 10, and the second capacitor C2 may be incorporated within the multilayer substrate 20. Alternatively, the second inductor L2 may be provided in both the mount component 10 and the multilayer substrate 20.

Figure 11:
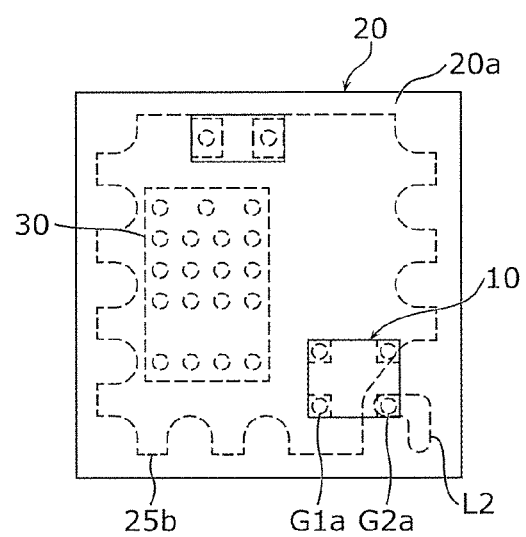
FIG. 11 is a plan view of the filter module according to the embodiment 1 viewed from one principal surface side of a multilayer substrate.

Next, the structure of the filter module 1 in a plan view is described. FIG. 11 is a plan view of the filter module 1 viewed from the one principal surface 20a side of the multilayer substrate 20.

On the one principal surface 20a of the multilayer substrate 20, a plurality of electronic components such as the mount component 10, the IC chip 30, and the like are mounted. In FIG. 11, positions of the ground ports G1a and G2a of the mount component 10 after the mounting are illustrated.

FIGS. 12A to 12E are plan views of the respective substrate layers s1 to s5 of the multilayer substrate 20. On each of the substrate layers s1 to s5, the conductor portions 22 such as patterning conductors and interlayer conductors are formed. In the multilayer substrate 20, the number of layers is not limited to five, and the multilayer substrate 20 may include three or more substrate layers.

Figure 12A:
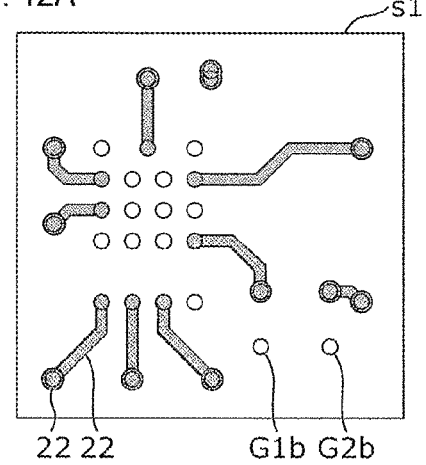
FIGS. 12A to 12E are plan views of respective substrate layers of the multilayer substrate of the filter module according to the embodiment 1.

As illustrated in FIG. 12A, on the substrate layer s1, which is the first and topmost layer, the ground ports G1b and G2b and the conductor portions 22 are formed for mounting the mount component 10 and the IC chip 30. The ground ports G1b and G2b are provided in such a manner as to match the positions of the ground ports G1a and G2a of the mount component 10 at the time of the mounting.

Figure 12B:
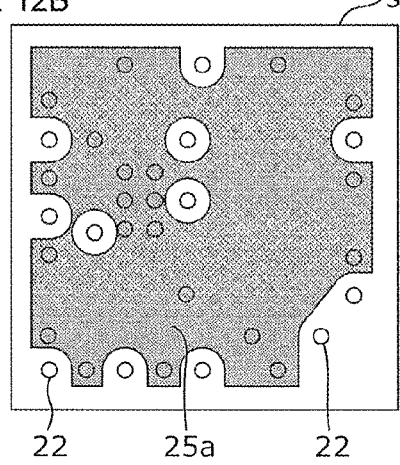

As illustrated in FIG. 12B, on the substrate layer s2, which is the second layer, the ground electrode 25a and the conductor portions 22 are formed. The ground electrode 25a is connected to the ground port G1b described above via the conductor portions 22 but is not connected to the ground port G2b. The area of the ground electrode 25a occupies about one-half or more of the area of the substrate layer s2.

Figure 12C:
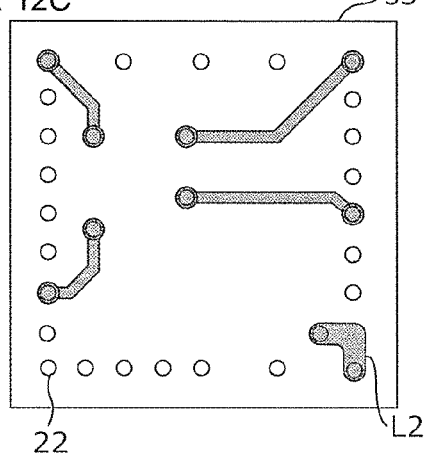

As illustrated in FIG. 12C, on the substrate layer s3, which is the third layer, the second inductor L2 and the conductor portions 22 are formed. The second inductor L2 is connected to the ground port G2b described above via the conductor portions 22. For example, the second inductor L2 is a patterning conductor having a substantially ½-turn coil shape. The second inductor L2 is formed on the substrate layer s3, which is a different layer from the substrate layers s2 and s4 where the ground electrodes 25a and 25b are formed. The second inductor L2 is a device that adjusts the inductance value of the second path r2 and is formed in such a manner as to have an inductance value less than that of the first inductor L1.

Figure 12D:
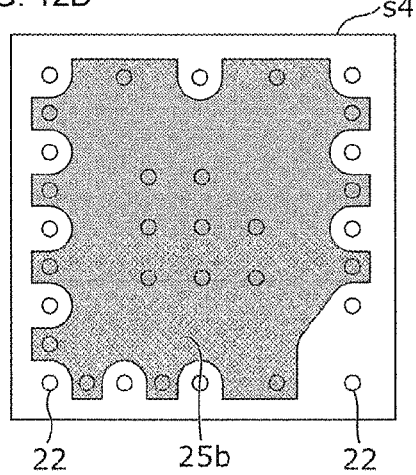

As illustrated in FIG. 12D, on the substrate layer s4, which is the fourth layer, the ground electrode 25b and the conductor portions 22 are formed. The ground electrode 25b is connected to the ground electrode 25a via the conductor portions 22. The area of the ground electrode 25b occupies about one-half or more of the area of the substrate layer s4.

Figure 12E:
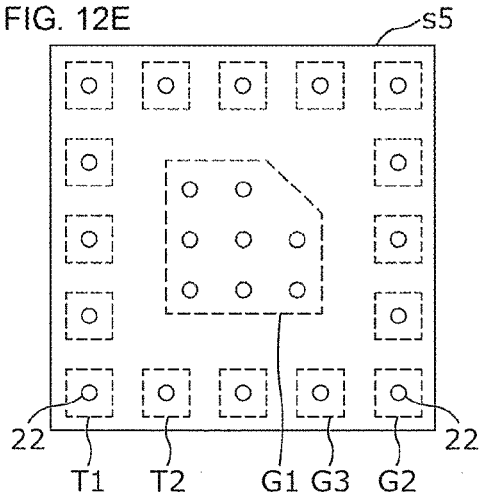

As illustrated in FIG. 12E, on the substrate layer s5, which is the fifth and lowermost layer, the conductor portions 22 and the external terminals are formed. Specifically, on the bottom face of the substrate layer s5, the signal terminals T1 and T2, the first ground terminal G1, the second ground terminal G2, and the third ground terminal G3, which are part of the external terminals, are formed. The first ground terminal G1 and the third ground terminal G3 are connected to the ground electrode 25b via the conductor portions 22. The second ground terminal G2 is connected to the second inductor L2 via the conductor portions 22. In the plan view of the substrate layer s5, the first ground terminal G1 is larger in area than the second ground terminal G2.

As described above, in the case where the area of the first ground terminal G1 to be connected to the ground electrode 25b is larger than the area of the second ground terminal G2, the ground electrode 25b and the first ground terminal G1 can be connected using a greater number of via conductors. Furthermore, in the case where the filter module 1 is mounted on the mother board, the ground can be connected using the conductor having a larger area. This enables to suppress electric potential variations of ground at the first ground terminal G1.

In this filter module 1, the second inductor L2 is arranged in such a manner as not to overlap the ground electrodes 25a and 25b in the plan view of the multilayer substrate 20 (see FIG. 11). This enables to hinder a leaked signal caused by the ground electrodes 25a and 25b from propagating to the second inductor L2. Furthermore, this enables to maintain an attenuation pole generated by LC resonance of the second inductor L2 and the second capacitor C2 and to suppress the degradation of attenuation outside the pass band of the LPF 15.

Note that similar advantageous effects can be provided in embodiments where a capacitor is incorporated within a multilayer substrate such as the one illustrated in the embodiment 3. For example, in the case where the capacitor incorporated within the multilayer substrate is arranged in such a manner as not to overlap the ground electrodes 25a and 25b, the degradation of attenuation outside the pass band of HPF can be suppressed. In the case where a capacitor is incorporated within the multilayer substrate, the capacitance value can be adjusted by changing the overlapping area of polar plates constituting the capacitor (overlapping area of one polar plate and the other polar plate in the plan view).

Modification Example 1, Modification Example 2, and Modification Example 3 of Embodiment 1

The modification example 1, the modification example 2, and the modification example 3 of the embodiment 1 are different from the embodiment 1 in the shape or size of the second inductor L2.

Figure 13:
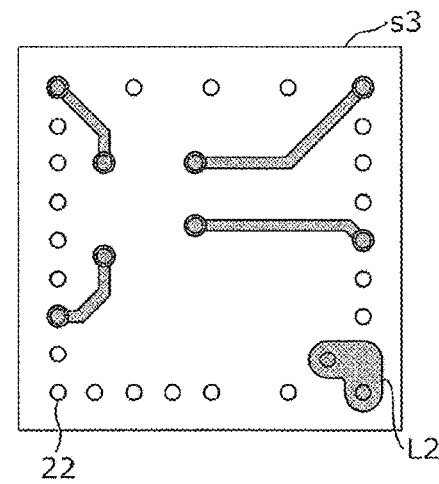
FIG. 13 is a diagram illustrating an exemplary substrate layer of a filter module according to a modification example 1 of the embodiment 1.

FIG. 13 is a diagram illustrating an exemplary substrate layer s3 of a filter module 1 according to the modification example 1. The second inductor L2 of the modification example 1 has a wider coil pattern width than the second inductor L2 of the embodiment 1. This increases the inductance value of the second inductor L2.

Figure 14:
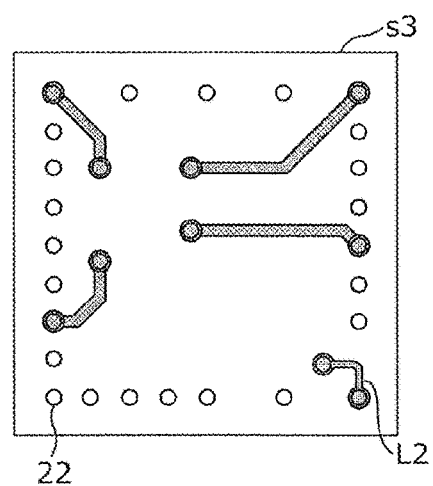
FIG. 14 is a diagram illustrating an exemplary substrate layer of a filter module according to a modification example 2 of the embodiment 1.

FIG. 14 is a diagram illustrating an exemplary substrate layer s3 of a filter module 1 according to the modification example 2. The second inductor L2 of the modification example 2 has a narrower coil pattern width than the second inductor L2 of the embodiment 1. This reduces the inductance value of the second inductor L2.

Figure 15:
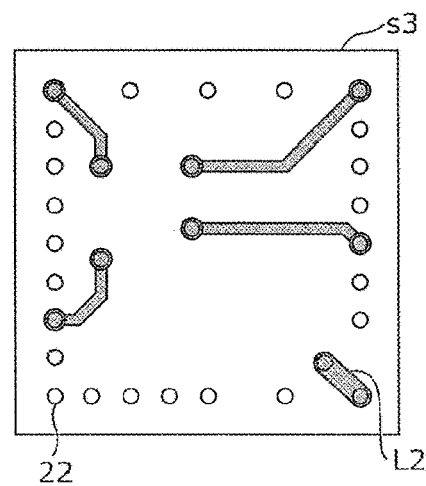
FIG. 15 is a diagram illustrating an exemplary substrate layer of a filter module according to a modification example 3 of the embodiment 1.

FIG. 15 is a diagram illustrating an exemplary substrate layer s3 of a filter module 1 according to the modification example 3. A coil pattern of the second inductor L2 of the modification example 3 is formed into a straight line shape and not a "L" shape. The inductance value of the second inductor L2 of the modification example 3 is different from that of the second inductor L2 of the embodiment 1.

As illustrated in the modification examples 1 to 3, the inductance value can be easily adjusted by changing the shape or the size of the second inductor L2 of the substrate layer s3. As described above, by having the second inductor L2 in the inside of the multilayer substrate 20, a design change of the inductance value of the second inductor L2 can be made easily, and this enables to form an attenuation pole using LC resonance of the second inductor L2 and the second capacitor C2 in a required frequency band. This enables to suppress the degradation of attenuation outside the pass band of the LPF 15.

Modification Example 4 of Embodiment 1

A filter module 1A according to the modification example 4 of the embodiment 1 is different from the embodiment 1 in that a mount component 10A includes a switch 16 in addition to the LPF 15.

Figure 16:
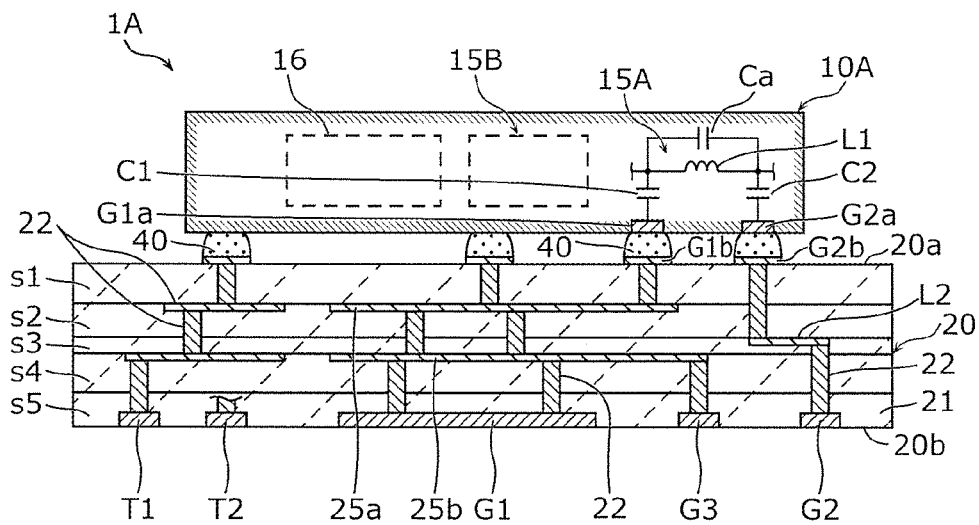
FIG. 16 is a cross-sectional view of a filter module according to a modification example 4 of the embodiment 1.
Figure 17:
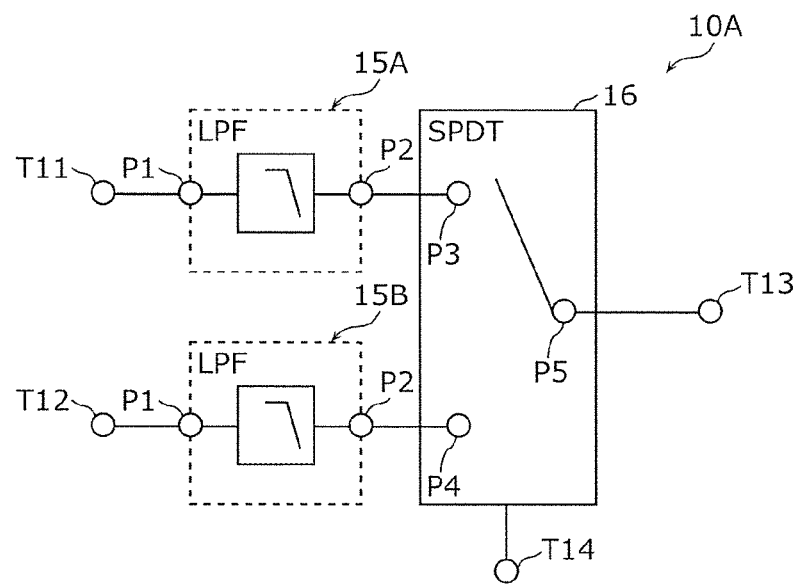
FIG. 17 is an exemplary circuit diagram of a mount component according to the modification example 4 of the embodiment 1.

FIG. 16 is a cross-sectional view of the filter module 1A according to the modification example 4 of the embodiment 1. FIG. 17 is an exemplary circuit diagram of the mount component 10A according to the modification example 4 of the embodiment 1.

As illustrated in FIG. 17, the mount component 10A of the modification example 4 includes two LPFs 15A and 15B and the switch 16. The mount component 10A includes, as external terminals, input/output terminals T11, T12, and T13 and a control terminal T14. Note that the LPFs 15A and 15B each have a configuration similar to that of the LPF 15.

Of the two LPFs 15A and 15B, the LPF 15A has an input/output port P1 connected to the input/output terminal T11 and an input/output port P2 connected to a selection terminal P3 of the switch 16. The LPF 15B, which is the other one of the two LPFs 15A and 15B, has an input/output port P1 connected to the input/output terminal T12 and an input/output port P2 connected to a selection terminal P4 of the switch 16. A common terminal P5 of the switch 16 is connected to the input/output terminal T13. Furthermore, the switch 16 is connected to the control terminal T14. This control terminal T14 is connected to a control circuit (not illustrated in the drawing) that performs a switch control of the switch 16.

In the filter module 1A of the modification example 4, the first path r1 and the second path r2 are not connected to each other by any path except the path between the first node n1 and the second node n2 and are respectively connected to different grounds. This enables to maintain another attenuation pole different from the attenuation pole of the LPF 15 and to suppress the degradation of attenuation outside the pass band.

Note that in the present modification example, the example is described in which a plurality of LPFs are provided in the mount component 10A. Alternatively, instead of the LPF 15B, a HPF, which will be illustrated in the embodiment 3, may be provided in the mount component 10A. Furthermore, with regard to the HPF which will be illustrated in the embodiment 3, modification examples similar to the foregoing modification examples may also be configured, and advantageous effects substantially equivalent to those of the foregoing modification examples can be provided.

Embodiment 2

A filter module 1B according to the embodiment 2 is different from that of the embodiment 1 in that the second inductor L2 is not provided in the multilayer substrate 20 but provided in a mount component 10B.

Figure 18:
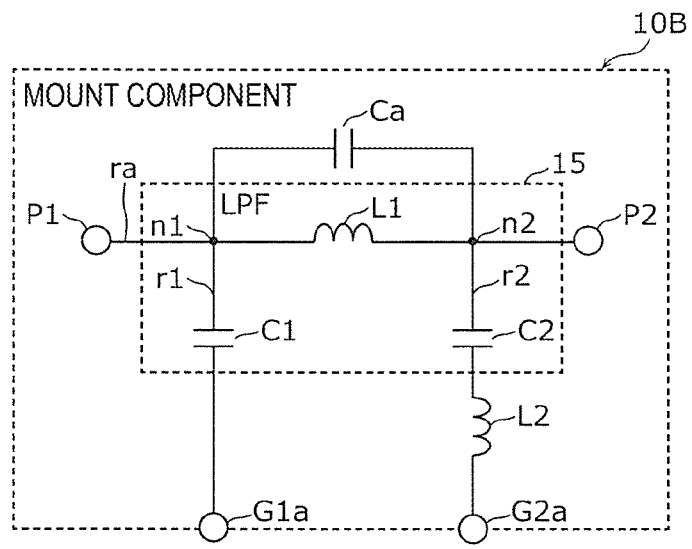
FIG. 18 is a circuit diagram of a mount component of a filter module according to an embodiment 2.
Figure 19:
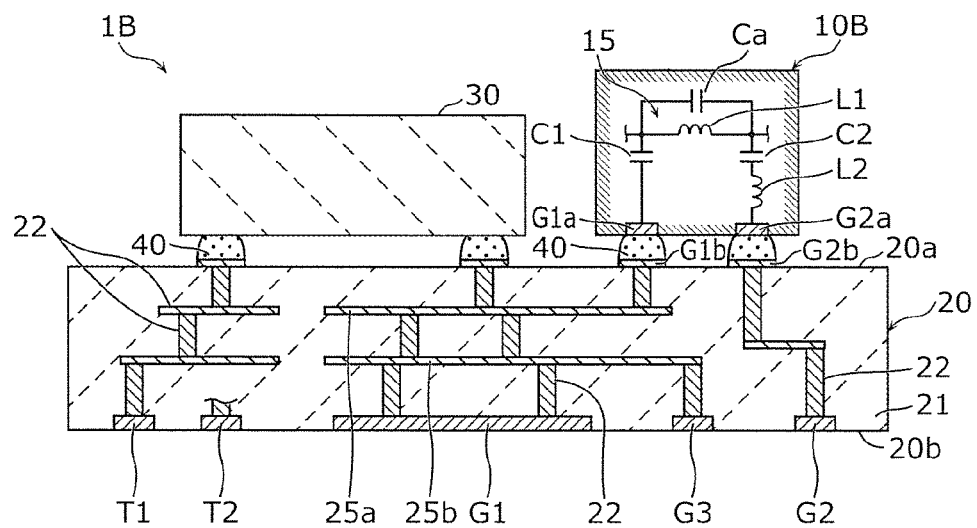
FIG. 19 is a cross-sectional view of the filter module according to the embodiment 2.

FIG. 18 is a circuit diagram of the mount component 10B of the filter module 1B according to the embodiment 2. FIG. 19 is a cross-sectional view of the filter module 1B.

The mount component 10B of the filter module 1B includes the second inductor L2 in addition to the LPF 15. Specifically, in the inside of the mount component 10B, one end portion of the second inductor L2 is connected to the second capacitor C2, and the other end portion of the second inductor L2 is connected to the ground port G2a. The ground port G2a is connected to the second ground terminal G2 via the joining material 40, the ground port G2b, and the conductor portions 22.

In the filter module 1B of the embodiment 2, the first path r1 and the second path r2 are also not connected to each other by any path except the path between the first node n1 and the second node n2 and are also respectively connected to different grounds. This enables to maintain another attenuation pole different from the attenuation pole of the LPF 15 and to suppress the degradation of attenuation outside the pass band.

Furthermore, in the filter module 1B of the embodiment 2, of the conductor portions 22 provided in the inside of the multilayer substrate 20, the conductor portions 22 arranged between the ground port G2b and the second ground terminal G2 can be changed in shape or size. The inductance value of the second path r2 can be adjusted by changing the shapes or sizes of these conductor portions 22.

Note that in the HPF which will be described in the embodiment 3, the capacitor C2 may also be provided in the mount component 10B.

Embodiment 3

In the embodiments 1 and 2, the embodiment in which the mount component 10 includes the LPF is mainly described. In the embodiment 3, an embodiment in which a mount component 10C includes a high pass filter (HPF) is mainly described.

3-1. Circuit Configuration of Filter Module

Figure 20:
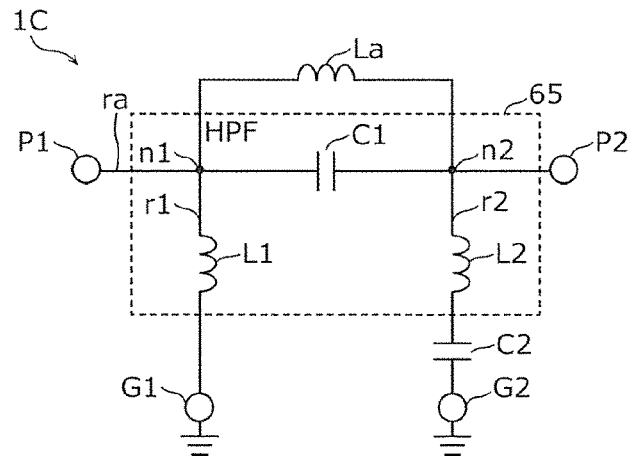
FIG. 20 is a circuit diagram of a filter module according to an embodiment 3.

Referring to FIG. 20, the filter module 1C of the embodiment 3 is described.

FIG. 20 is a circuit diagram of the filter module 1C according to the embodiment 3. The filter module 1C includes a HPF 65, the second capacitor C2, the first ground terminal G1, and the second ground terminal G2.

The first ground terminal G1 and the second ground terminal G2 are part of external terminals included in the filter module 1C. The first ground terminal G1 and the second ground terminal G2 are terminals connected to the ground and are each connected to the ground via a mother board on which the filter module 1C is mounted.

The HPF 65 is arranged in the input/output path ra of signals, which is a path connecting the input/output ports P1 and P2. The HPF 65 includes the first capacitor C1, the first inductor L1, and the second inductor L2. The first capacitor C1 is connected in series in the input/output path ra. The first inductor L1 is provided in the first path r1 that connects the first ground terminal G1 and the first node n1 in the input/output path ra on the side of one end portion of the first capacitor C1. The second inductor L2 is provided in the second path r2 that connects the second ground terminal G2 and the second node n2 in the input/output path ra on the side of the other end portion of the first capacitor C1. These input/output path ra, the first path r1, and the second path r2 are not paths in space but are physical objects in existence, and are for example formed from a mount component and/or wirings provided in a multilayer substrate, which will be described below.

Note that in this filter module 1C, the inductor La for attenuation pole adjustment is connected in parallel to the first capacitor C1 in the input/output path ra. The inductor La is not an essential constituting element in the present embodiment.

The second capacitor C2 is connected in series to the second inductor L2 in a path connecting the second inductor L2 and the second ground terminal G2, and this path is part of the second path r2. The provision of the second capacitor C2 allows the filter module 1C to have a series LC resonant circuit that includes the second capacitor C2 and the second inductor L2.

In the configuration of the present embodiment, the first path r1 and the second path r2 are connected to each other in between the first node n1 and the second node n2 via the first capacitor C1 and not connected to each other by any path except the one between the first node n1 and the second node n2. This enables the present embodiment to have the structure that provides advantageous effects similar to those of the embodiment 1.

Note that in the present embodiment, the second inductor L2 and the second capacitor C2 are connected in this order when the second ground terminal G2 is viewed from the second node n2 which is the other end portion side of the first capacitor C1. Alternatively, the second inductor L2 and the second capacitor C2 may be connected in the opposite order. That is to say, when the second ground terminal G2 is viewed from the second node n2, the second capacitor C2 and the second inductor L2 may be connected in this order.

3-2. Structure of Filter Module

Figure 21:
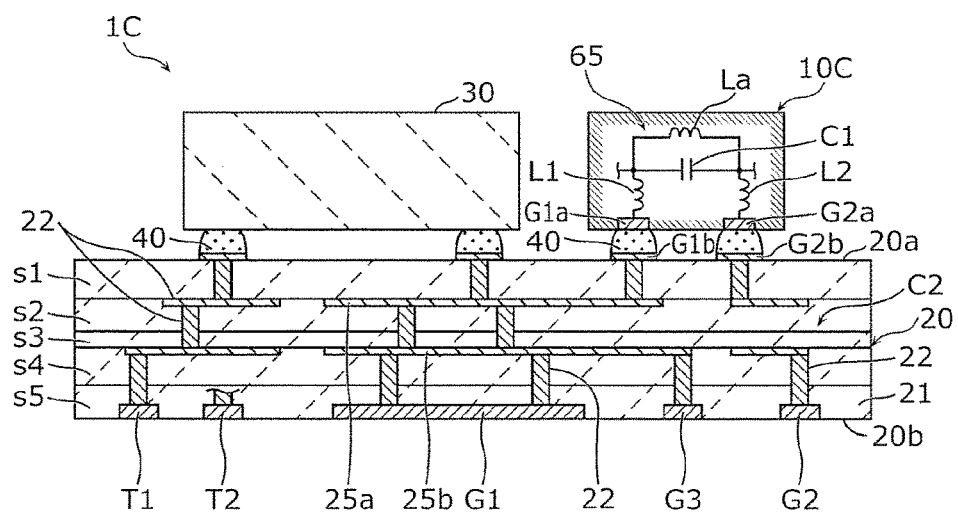
FIG. 21 is a cross-sectional view of the filter module according to the embodiment 3.
Figure 22:
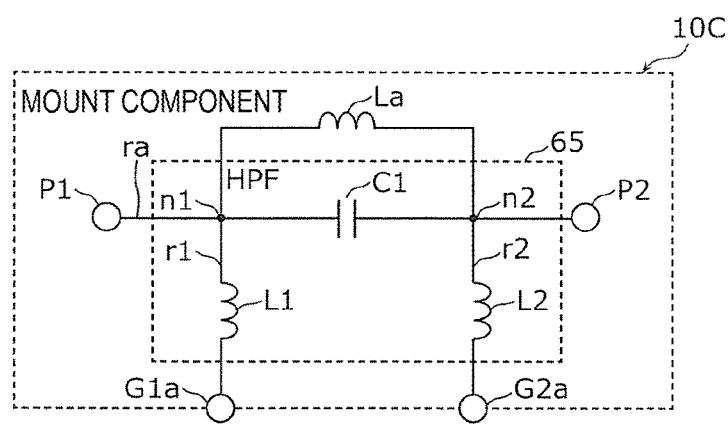
FIG. 22 is a circuit diagram of a mount component of the filter module according to the embodiment 3.

Next, referring to FIG. 21 and FIG. 22, the structure of the filter module 1C is described. FIG. 21 is a cross-sectional view of the filter module 1C. FIG. 22 is a circuit diagram of a mount component 10C of the filter module 1C.

The filter module 1C includes the mount component 10C, the IC chip 30, and the multilayer substrate 20. In the filter module 1C of the present embodiment, the HPF 65 is provided in the mount component 10C, and the second capacitor C2 is provided in the multilayer substrate 20.

The IC chip 30 is, for example, a semiconductor circuit device including a semiconductor device such as a switching element or the like.

The mount component 10C is a filter component having a substantially rectangular parallelepiped outer shape. The mount component 10C includes the HPF 65 including the first capacitor C1, the first inductor L1, and the second inductor L2 and the inductor La connected in parallel to the first capacitor C1. The mount component 10C may be a multilayer ceramic component or an integrated passive device (IPD). In the mount component 10C, the input/output path ra, the part of the first path r1, and the part of the second path r2, which are described above, are formed. These input/output path ra, the part of the first path r1, and the part of the second path r2 are formed from wirings provided in the mount component 10C.

At a bottom face of the mount component 10C, the ground ports G1a and G2a, which are the external terminals, are formed. The ground port G1a is connected to the first inductor L1 of the HPF 65, and the ground port G2a is connected to the second inductor L2 of the HPF 65. Note that the bottom face of the mount component 10C is a surface that faces one principal surface 20a of the multilayer substrate 20 when the mount component 10C is mounted on the multilayer substrate 20. The mount component 10C is mounted on the multilayer substrate 20 using the joining material 40.

The ground ports G1b and G2b, which are connection electrodes, are formed on the one principal surface 20a of the multilayer substrate 20. The ground port G1a of the mount component 10C is connected to the ground port G1b of the multilayer substrate 20 with the joining material 40 interposed therebetween, and the ground port G2a of the mount component 10C is connected to the ground port G2b of the multilayer substrate 20 with the joining material 40 interposed therebetween.

The multilayer substrate 20 includes the substrate portion 21 formed by stacking a plurality of the substrate layers s1, s2, s3, s4, and s5 on top of each other and the conductor portions 22 provided in the inside of and on the surfaces of the multilayer substrate 20. The conductor portions 22 are made up of patterning conductors and interlayer conductors and, for example, formed of a metallic material whose main component is copper or silver. The multilayer substrate 20 may be a substrate including a ceramic material, or a flexible substrate including a resin material, or a semiconductor circuit substrate formed by photolithography processing. Of the first path r1 and the second path r2, other than the ones formed in the mount component 10C, the remaining part of the first path r1 and the remaining part of the second path r2 are formed in the multilayer substrate 20. These remaining part of the first path r1 and remaining part of the second path r2 are formed from wirings including the conductor portions 22.

The ground electrodes 25a and 25b are provided in the inside of the multilayer substrate 20. The ground electrodes 25a and 25b are each a common ground electrode that makes ground potentials of a plurality of electronic components mounted on the multilayer substrate 20 uniform. Each of the ground electrodes 25a and 25b is provided in a path connecting the first inductor L1 of the mount component 10C and the first ground terminal G1, and this path is part of the first path r1. The ground electrodes 25a and 25b are formed of the same metallic material as that of the conductor portions 22.

Furthermore, the second capacitor C2 is formed in the inside of the multilayer substrate 20. The second capacitor C2 is formed of the same metallic material as that of the conductor portions 22.

The ground electrodes 25a and 25b are connected to the ground port G1b via the conductor portions 22. Whereas, the second capacitor C2 is not connected to the ground electrode 25a or the ground electrode 25b in the inside of the multilayer substrate 20 and is connected to the ground port G2b via the conductor portions 22.

A plurality of external terminals are provided on the other principal surface 20b of the multilayer substrate 20. In FIG. 21, as part of the plurality of external terminals, the signal terminals T1 and T2, the first ground terminal G1, the second ground terminal G2, and the third ground terminal G3 are illustrated.

The signal terminals T1 and T2 are each a terminal for inputting/outputting a high frequency signal to/from the filter module 1C or a terminal for inputting a control signal for controlling the filter module 1C. The signal terminals T1 and T2 are each connected to the mount component 10C or the IC chip 30 via the conductor portions 22.

The first ground terminal G1 is connected to the ground electrodes 25b and 25a via the conductor portions 22. In other words, the first ground terminal G1 is connected to the ground port G1b via the conductor portions 22 and the ground electrodes 25b and 25a and further connected to the ground port G1a of the mount component 10C with the joining material 40 interposed therebetween.

The third ground terminal G3 is connected to the ground electrodes 25b and 25a and further connected to the first ground terminal G1 via each of the ground electrodes 25b and 25a. In this way, in the filter module 1C, all the ground terminals (for example, the first ground terminal G1 and the third ground terminal G3) except the second ground terminal G2 are connected to the ground electrodes (for example, the ground electrodes 25a and 25b) provided in the inside of the multilayer substrate 20.

The second ground terminal G2 is connected to the second capacitor C2 via the conductor portions 22. In other words, the second ground terminal G2 is connected to the ground port G2b via the conductor portions 22 and the second capacitor C2 and further connected to the ground port G2a of the mount component 10C with the joining material 40 interposed therebetween. The second ground terminal G2 is an independent terminal not connected to the first ground terminal G1 or the third ground terminal G3 in the multilayer substrate 20. Accordingly, in the inside of the multilayer substrate 20, the second path r2 leading to the second ground terminal G2 is not connected to any of the ground electrodes (for example, the ground electrodes 25b and 25a) provided inside the multilayer substrate 20. Further, in the multilayer substrate 20, the second path r2 is not connected to any of the ground terminals (for example, the first ground terminal G1 and the third ground terminal G3) except the second ground terminal G2.

The filter module 1C of the present embodiment includes the ground electrodes 25a and 25b provided in the first path r1 and has a structure in which the ground electrodes 25a and 25b are not connected to the second path r2. That is to say, the filter module 1C has the structure in which the first path r1 and the second path r2 are not connected to each other by any path except the path between the first node n1 and the second node n2 inside of the filter module 1C. Accordingly, it becomes possible to hinder a signal having entered the ground electrode 25a or the ground electrode 25b from going into the second path r2. This enables to maintain an attenuation pole generated by LC resonance of the second capacitor C2 and the second inductor L2 and to suppress the degradation of attenuation outside the pass band of the HPF 65.

Note that in the present embodiment, the filter module 1C is illustrated in which the second inductor L2 is provided in the mount component 10C and the second capacitor C2 is incorporated within the multilayer substrate 20. Alternatively, the second capacitor C2 may be provided in the mount component 10C, and the second inductor L2 may be incorporated within the multilayer substrate 20. Alternatively, part of the second inductor L2 that has been provided in the mount component 10C may be incorporated within the multilayer substrate 20.

Embodiment 4

Figure 23:
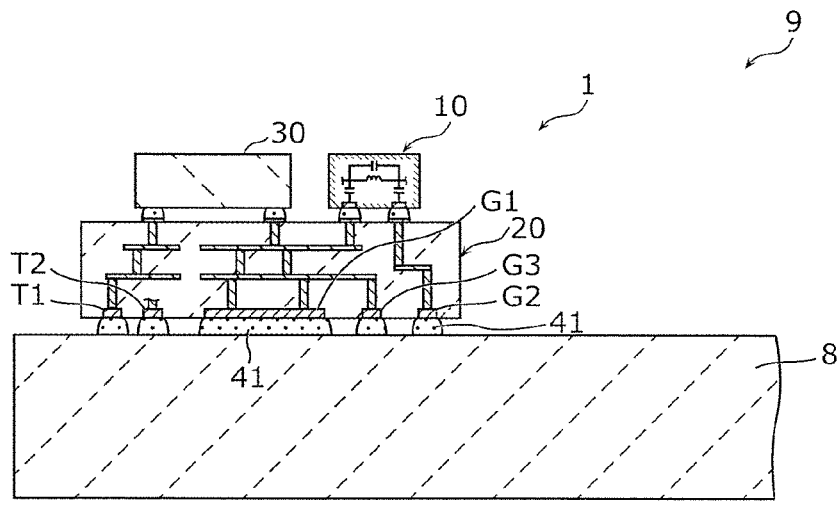
FIG. 23 is a cross-sectional view of a high frequency module according to an embodiment 4.

In the embodiment 4, a high frequency module 9 including the filter module 1 is described. FIG. 23 is a cross-sectional view of the high frequency module 9 according to the embodiment 4.

As illustrated in FIG. 23, the high frequency module 9 includes the filter module 1 and a mounting board (mother board) 8. The filter module 1 is connected to the mounting board 8 using a joining material 41.

Specifically, the signal terminals T1 and T2, the first ground terminal G1, the second ground terminal G2, and the third ground terminal G3 of the filter module 1 are connected to connection electrodes formed on a principal surface of the mounting board 8 using the joining material 41. These connection electrodes of the mounting board 8 are connected to each other in the inside of the mounting board 8 and then connected to the ground.

In the high frequency module 9 of the present embodiment, the first path r1 and the second path r2 are not connected to each other by any path except the path between the first node n1 and the second node n2 in the inside of the filter module 1 and are respectively connected to different grounds in the inside of the filter module 1. This enables the filter module 1 to maintain another attenuation pole different from the attenuation pole of the LPF 15 and to suppress the degradation of attenuation outside the pass band. This enables to provide the high frequency module 9 including the filter module 1 having an excellent attenuation characteristic.

Note that in the case where an HPF is used in the foregoing embodiment instead of the LPF, a high frequency module including a high pass filter module having an excellent attenuation characteristic can be provided.

Other Embodiments

The filter modules according to the embodiments of the present disclosure and the modification examples thereof have been described in the above. However, the present disclosure is not limited to each of the embodiments and modification examples. Embodiments obtained by applying various modifications apparent to those skilled in the art to the embodiments and the modification examples and embodiments formed by combining constituting elements of different embodiments may also be included in the scope of the one or more aspects of the present disclosure as long as they do not depart from the scope of the present disclosure.

Figure 24:
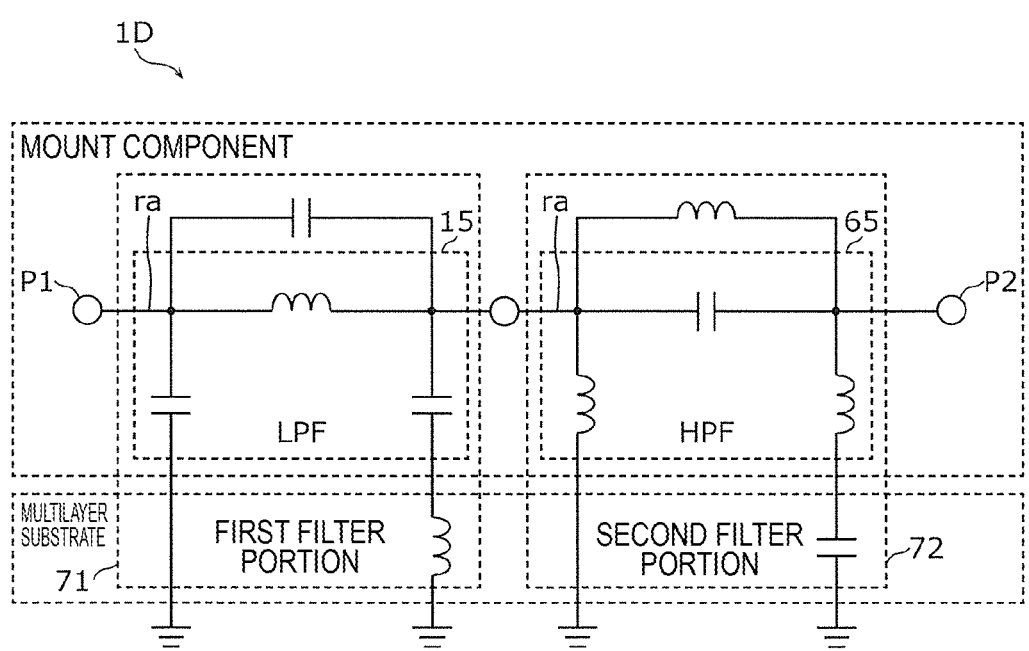
FIG. 24 is a circuit diagram of a filter module according to another embodiment.

For example, as illustrated in FIG. 24, a filter module 1D according to another embodiment may have a circuit configuration in which the filter module 1D includes a first filter portion 71 that is the filter module 1 and a second filter portion 72 that is the filter module 1C, and an input/output path ra of the first filter portion 71 and an input/output path ra of the second filter portion 72 are connected in series to each other.

Because the filter module 1D includes the first filter portion 71 including the low pass filter 15 and the second filter portion 72 including the high pass filter 65, it becomes possible to provide the filter module 1D including a band pass filter having an excellent attenuation characteristic.

Alternatively, in the filter module 1D, of the first filter portion 71, the mount component 10 illustrated in FIG. 10 (part at least including the LPF illustrated in FIG. 10) and of the second filter portion 72, the mount component 10C illustrated in FIG. 22 (part at least including the HPF illustrated in FIG. 22) may be formed into the same single mount component, and of the first filter portion 71, the multilayer substrate 20 illustrated in FIG. 9 and of the second filter portion 72, the multilayer substrate 20 illustrated in FIG. 21 may be formed into the same single multilayer substrate. Note that "formed into the same single mount component" means, for example, that all the elements included in all the mount components are packaged in a single housing, or are molded as a single molded resin article, or are formed into a single semiconductor chip, or the like.

By forming the first filter portion 71 including the low pass filter 15 and the second filter portion 72 including the high pass filter 65 into a single mount component, at least part of a band pass filter can be formed as the mount component, and the filter module 1D having a stable attenuation characteristic can be provided.

The present disclosure can be widely used in communication devices such as cellular phones and the like as filter modules and high frequency modules each having an excellent attenuation characteristic.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A filter module comprising:
a multilayer substrate;
a mount component mounted on the multilayer substrate;
a first ground terminal;
a second ground terminal that is different from the first ground terminal;
a low pass filter including a first inductor, a first capacitor, and a second capacitor, the first inductor being provided in an input/output path of a signal, the first capacitor being provided in a first path connecting the first ground terminal and a first node of the input/output path on a first side of one end portion of the first inductor, the second capacitor being provided in a second path connecting the second ground terminal and a second node of the input/output path on a second side of another end portion of the first inductor; and
a second inductor connected in series to the second capacitor in a third path connecting the second capacitor and the second ground terminal, the third path being part of the second path, wherein
the first ground terminal and the second ground terminal are provided on the multilayer substrate,
at least a part of the low pass filter is included in the mount component,
at least one of the second inductor or the second capacitor is included in at least one of the multilayer substrate or the mount component, respectively, and
the first path and the second path are connected to one another between the first node and the second node via the first inductor and are not connected to one another by any other path except by a fourth path between the first node and the second node.

2. A high frequency module comprising:
the filter module according to claim 1, and
a mounting board on which the filter module is mounted.

3. The filter module according to claim 1, further comprising:
a ground electrode provided in a fifth path connecting the first capacitor and the first ground terminal, the fifth path being part of the first path, wherein
the ground electrode is provided inside the multilayer substrate and is not connected to the second path inside the multilayer substrate.

4. The filter module according to claim 3, wherein
the multilayer substrate includes at least one of the ground electrode, and
the second path is not connected to the at least one of the ground electrode inside the multilayer substrate.

5. The filter module according to claim 3, wherein
at least one of the second inductor or the second capacitor is provided inside the multilayer substrate.

6. The filter module according to claim 3, wherein
the second inductor is provided inside the multilayer substrate, and
in a plan view of the multilayer substrate viewed from one principal surface side of the multilayer substrate, the second inductor does not overlap the ground electrode.

7. The filter module according to claim 1, wherein
at least two ground terminals including the first ground terminal and the second ground terminal are arranged on the multilayer substrate, and
the second path is connected only to the second ground terminal arranged in the multilayer substrate.

8. A filter module comprising:
a first filter portion that is the filter module according to claim 1 and
a second filter portion comprising:
a first ground terminal;
a second ground terminal that is different from the first ground terminal;
a high pass filter including a first capacitor, a first inductor, and a second inductor, the first capacitor being provided in an input/output path of a signal, the first inductor being provided in a first path connecting the first ground terminal and a first node of the input/output path on a first side of one end portion of the first capacitor, the second inductor being provided in a second path connecting the second ground terminal and a second node of the input/output path on a second side of another end portion of the first capacitor;
a second capacitor connected in series to the second inductor in a third path connecting the second inductor and the second ground terminal, the third path being part of the second path;
a multilayer substrate; and
a mount component mounted on the multilayer substrate, wherein:
the first ground terminal and the second ground terminal are provided on the multilayer substrate,
at least a part of the high pass filter is included in the mount component, and
at least one of the second inductor or the second capacitor is included in at least one of the multilayer substrate or the mount component, respectively, and
the first path and the second path are connected to one another between the first node and the second node via the first capacitor and are not connected to one another by any other path except by a fourth path between the first node and the second node, wherein
the mount component of the first filter portion and the mount component of the second filter portion are arranged in a same single mount component, and
the multilayer substrate of the first filter portion and the multilayer substrate of the second filter portion are arranged in a same single multilayer substrate.

9. A filter module comprising:
a first filter portion that is the filter module according to claim 1; and
a second filter portion comprising:
a first ground terminal;
a second ground terminal that is different from the first ground terminal;

a high pass filter including a first capacitor, a first inductor, and a second inductor, the first capacitor being provided in an input/output path of a signal, the first inductor being provided in a first path connecting the first ground terminal and a first node of the input/output path on a first side of one end portion of the first capacitor, the second inductor being provided in a second path connecting the second ground terminal and a second node of the input/output path on a second side of another end portion of the first capacitor; and a second capacitor connected in series to the second inductor in a third path connecting the second inductor and the second ground terminal, the third path being part of the second path, wherein the first path and the second path are connected to one another between the first node and the second node via the first capacitor and are not connected to one another by any other path except by a fourth path between the first node and the second node, and wherein the input/output path of the first filter portion and the input/output path of the second filter portion are connected to one another in series.

10. The filter module according to claim 1, further comprising:

two low pass filters, and a switch having a first selection terminal connected to a first input/output port of a first low pass filter, a second selection terminal connected to a second input/output port of a second low pass filter, and a common terminal connected to a third input/output terminal.

11. The filter module according to claim 10, wherein the third input/output terminal is an external terminal of the mount component.

12. The filter module according to claim 10, wherein the switch is arranged in the mount component.

13. The filter module according to claim 1, wherein at least one of the second inductor or the second capacitor is provided inside the multilayer substrate.

14. A filter module comprising:

a first ground terminal;

a second ground terminal that is different from the first ground terminal;

a high pass filter including a first capacitor, a first inductor, and a second inductor, the first capacitor being provided in an input/output path of a signal, the first inductor being provided in a first path connecting the first ground terminal and a first node of the input/output path on a first side of one end portion of the first capacitor, the second inductor being provided in a second path connecting the second ground terminal and a second node of the input/output path on a second side of another end portion of the first capacitor; and a second capacitor connected in series to the second inductor in a third path connecting the second inductor and the second ground terminal, the third path being part of the second path, wherein the first path and the second path are connected to one another between the first node and the second node via the first capacitor and are not connected to one another by any other path except by a fourth path between the first node and the second node.

15. The filter module according to claim 14, further comprising:

a multilayer substrate; and a mount component mounted on the multilayer substrate, wherein the first ground terminal and the second ground terminal are provided on the multilayer substrate, at least a part of the high pass filter is included in the mount component, and at least one of the second inductor or the second capacitor is included in at least one of the multilayer substrate or the mount component, respectively.

16. The filter module according to claim 15, further comprising:

a ground electrode provided in a fifth path connecting the first inductor and the first ground terminal, the fifth path being part of the first path, wherein the ground electrode is provided inside the multilayer substrate and is not connected to the second path inside the multilayer substrate.

17. The filter module according to claim 16, wherein at least one of the second capacitor or the second inductor is provided inside the multilayer substrate.

18. The filter module according to claim 16, wherein the second capacitor is provided inside the multilayer substrate, and in a plan view of the multilayer substrate viewed from one principal surface side of the multilayer substrate, the second capacitor does not overlap the ground electrode.

19. The filter module according to claim 15, wherein at least one of the second capacitor or the second inductor is provided inside the multilayer substrate.

* * * * *